United States Patent [19]

Schaal

[11] 4,132,813
[45] Jan. 2, 1979

[54] METHOD FOR PRODUCING SOLDERABLE METALLIZED LAYER ON A SEMICONDUCTING OR INSULATING SUBSTRATE

[75] Inventor: Gerhard Schaal, Belsen, Germany

[73] Assignee: Robert Bosch GmbH, Stuttgart, Germany

[21] Appl. No.: 734,770

[22] Filed: Oct. 22, 1976

[30] Foreign Application Priority Data

Nov. 11, 1975 [DE] Fed. Rep. of Germany ....... 2550512

[51] Int. Cl.$^2$ ............................................. C23L 13/02
[52] U.S. Cl. .................................. 427/90; 204/192 C; 427/91; 427/92; 427/93; 427/94; 427/124; 427/383 A; 427/383 B
[58] Field of Search ............... 204/192 C; 427/383 A, 427/383 B, 90, 91, 92, 123, 124, 93, 94; 29/577

[56] References Cited

U.S. PATENT DOCUMENTS

| | | | |
|---|---|---|---|
| 3,479,736 | 11/1969 | Toki et al. ........................ | 427/383 A |
| 3,579,375 | 5/1972 | Wonilowicz ........................... | 427/92 |
| 3,633,269 | 1/1972 | Bachmeier ............................ | 427/91 |
| 3,806,361 | 4/1974 | Lehner ............................... | 427/383 A |
| 3,922,385 | 11/1975 | Konantz et al. ....................... | 427/91 |
| 3,965,279 | 6/1976 | Levinstein ........................... | 427/383 |

FOREIGN PATENT DOCUMENTS

2143906  9/1974  Fed. Rep. of Germany.

*Primary Examiner*—John D. Smith
*Attorney, Agent, or Firm*—Flynn & Frishauf

[57] ABSTRACT

The provision of a supplementary layer of nickel by an electroless process in order to provide solder wetting capability for a tempered aluminum-nickel metallization is made unnecessary by causing the layer of nickel deposited on an underlying aluminum metallization layer to have a thickness between 0.6 and 1.0 μm and by conducting the subsequent tempering operation between 400 and 480° C, preferably 475° C, for a period of between 10 and 20 minutes, preferably 15 minutes. In order to provide high transverse conductivity, the aluminum layer should have a thickness between 3 and 10 μm. The process is useful in the manufacture of semiconductor devices as well as for making electrical devices based on an insulating substrate.

13 Claims, 4 Drawing Figures

METHOD FOR PRODUCING SOLDERABLE METALLIZED LAYER ON A SEMICONDUCTING OR INSULATING SUBSTRATE

This invention concerns a method for production of solder-compatible metallized layers of high transverse electrical conductivity on an insulating or semiconductor substrate, particularly a method in which an aluminum layer with the desired transverse electrical conductitivy is first applied to the substrate and then a comparatively thin nickel layer is applied on top, after which a tempering treatment is carried out in a non-oxidizing atmosphere, the product being held for a particular time somewhat below the temperature at which a liquid phase is formed between the substrate and the aluminum layer.

A process of the above-described kind is disclosed in German published patent application (AS) No. 2,143,906, in which during the tempering treatment the aluminum layer and the nickel layer combine to form a single layer of aluminum and nickel which is not compatible with solder, so that thereafter it is necessary to apply a second nickel layer by the so-called "electroless" process in order to make the resulting metallization solderable.

It is an object of the present invention to provide a simplified process of the kind above identified that will avoid the necessity of applying a second nickel layer.

SUMMARY OF THE INVENTION

Briefly, the thickness of the nickel layer applied on top of the aluminum layer and the time and temperature of the tempering treatment are so adjusted to each other that, on the one hand, adequate contact between the substrate and the metallization is obtained and, on the other hand, the solderability of the metallization is preserved. In particular, the thickness of the nickel layer is kept within the limit of 0.6 to 1.0 $\mu$m, the tempering temperature within the limit of 400 to 480° C. and the tempering time within the limit of 10 to 20 minutes. The thickness of the aluminum layer is preferably between 3 and 10 $\mu$m. In the preferred method, the tempering temperature is about 475° C. and the tempering time about 15 minutes.

The method of the invention is applicable to the manufacture of multiple semiconductor devices for providing both connection paths within the device and contact areas for the soldering on of external leads. The metallization may be on top of a protective insulating layer of silicon oxide or nitride, or such a protective layer topped by a glass layer, contact windows being provided through the protective layer for the electrodes of the various semiconductor devices previously manufactured in the substrate.

The method of the invention is also applicable to thin or thick layer electronic devices manufactured on a glass or a ceramic substrate. Preferably, the aluminum and the nickel layers are successively applied under high vacuum without interruption of the vacuum and they may be applied by vapor deposition or by sputtering.

The invention is further described with reference to an illustrative example of the method, in this particular case the application of the method to a multiple semiconductor device, and this further description is made with reference to the annexed drawings, in which.

Figure 1:
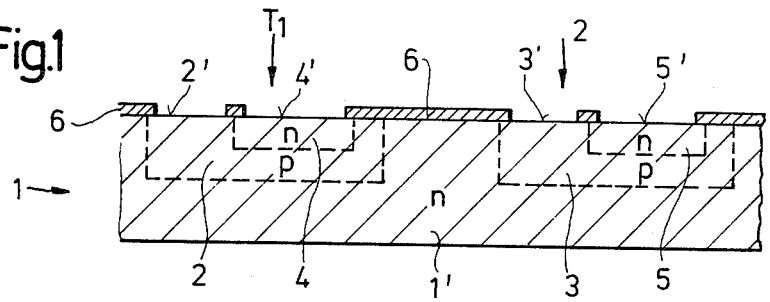
FIG. 1 is a diagrammatic cross-section of a portion of a multiple semiconductor device which includes a Darlington transistor combination, prior to the application of an aluminum layer.

The monolithic Darlington amplifier in the portion of a monolithic multiple semiconductor device shown in the figures of the drawings has the following known characteristics, produced by known methods of semiconductor device manufacturing, prior to completion of the device by the use of the process of the present invention: in a semiconductor wafer 1 of n-type silicon, two base zones 2 and 3 of p-type conductivity have been provided by diffusion of an appropriate dopant and in both of these base zones, the emitter zones 4 and 5 of n-type conductivity have respectively been provided by diffusion of another dopant, so as to produce a double npn zone sequence. Thus, there have been produced in the substrate 1 two transistors with a common collector 1', including a first transistor $T_1$ formed of the zone sequence 1', 2 and 4 and a second transistor $T_2$ formed of the zone sequence 1', 3 and 5.

These two transistors $T_1$ and $T_2$ are now to be connected to each other in a Darlington circuit. Assuming that the first transistor $T_1$ is the driver transistor and the second transistor $T_2$ is the power transistor of the Darlington amplifier, it is necessary to provide an electrically conducting connection between the emitter zone 4 of the first transistor $T_1$ and the base zone 3 of the second transistor $T_2$. This electrically conducting connection can be provided by a layer of metallization that will extend from the emitter zone 4 of the first transistor $T_1$ over the silicon dioxide layer 6 to the base zone 3 of the second transistor $T_2$. Furthermore, it is necessary to provide metallization for the connection of external leads to the base zone 2 of the first transistor $T_1$, to the emitter zone 5 of the second transistor $T_2$ and to the common collector zone 1' of the two transistors $T_1$ and $T_2$. This metallization can be applied in a novel way with great advantages by the present invention in the manner described below.

The silicon wafer 1 already has its base zones 2 and 3 and emitter zones 4 and 5 formed therein by diffusion of the appropriate conductivity-affecting impurities. Furthermore, for the protection of the pn junctions of the semiconductor devices formed in the semiconductor body, the silicon wafer is covered with a silicon dioxide layer 6. By means of a photolithographic process, contact windows 2', 3', 4' and 5' are etched into the silicon dioxide layer 6 by conventional processing for that purpose. After removal of the photoresist through which the etching is done, the wafer is carefully washed and dried. This brings the wafer into the condition shown in FIG. 1 where it constitutes the substrate on which metallization layers are to be provided in accordance with the method of the present invention.

The wafer is then placed in a high vacuum metallizing chamber and at a pressure between $10^{-6}$ and $10^{-5}$ Torr and aluminum layer 7 is applied by vapor deposition and, without interruption of the vacuum, a nickel layer 8 is then applied likewise by vapor deposition, these layers being applied to both sides of the wafer. The thickness of the aluminum layer 7 on the upper side of the wafer is in the range between 7 and 10 um and the thickness of the nickel layer 8 (FIG. 3) is in the range from 0.6 to 1.0 um. Because of reduced requirements for transverse conductivity of the aluminum layer on the underside of the wafer, the aluminum layer 7 on the underside may be thinner than the corresponding layer on the upper side. In order to prevent the formation of a brittle contact, however, the thickness of the aluminum layer there should not go below 3 $\mu$m.

Figure 2:
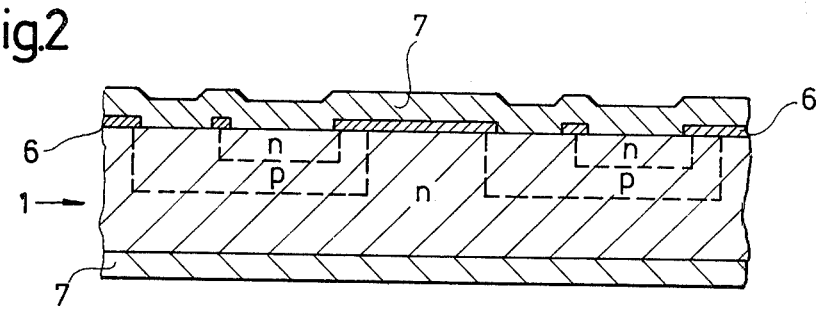
FIG. 2 is a cross-section of the semiconductor device portion of FIG. 1 after the application of an aluminum layer in accordance with the present invention.
Figure 3:
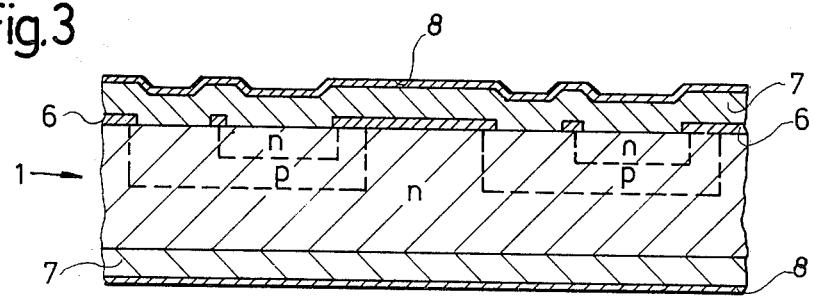
FIG. 3 is a diagrammatic cross-section of the semiconductor device portion of FIG. 2 after the application of a nickel layer in accordance with the present invention.

FIG. 2 shows the silicon wafer 1 after the deposition from vapor of the aluminum layer 7 and FIG. 3 shows it after the vapor-deposition of the nickel layer 8.

Figure 4:
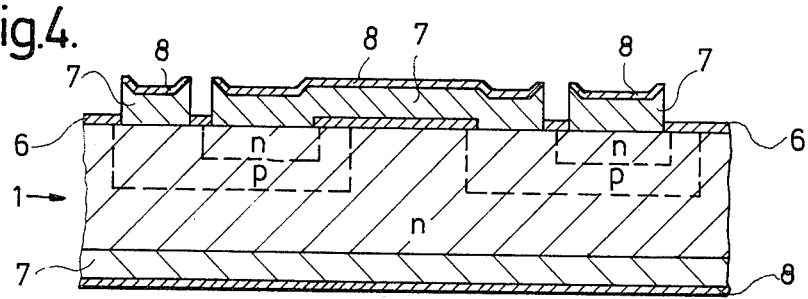
FIG. 4 is a diagrammatic cross-section of the semiconductor device portion of FIG. 3 after an etching step to provide a desired contour of the metallization layer that precedes the tempering step according to the invention.

The metallization consisting of the layers 7 and 8 on the upper side of the semiconductor wafer is then removed where it is not necessary, that being done by means of a well-known photolithographic process. In such a process, the surface of the wafer is covered with a photoresist (photoresists for this purpose are commercially available) from which a mask is made by a photographic process, leaving the portions of the metallization 7,8 that are not to be removed protected by the photoresist mask, whereas the portions of metallization to be removed are exposed. The drawings do not show the stage in which the wafer is covered with a photoresist, nor the stage in which the photoresist has been developed to form a mask. The masked wafer is then dipped in a bath containing preponderantly phosphoric acid, with an additional content of nitric acid and water. In a typical composition the proportions of phosphoric acid, nitric acid and water are respectively 74 percent, 11 percent and 15 percent. The treatment temperature for this step is preferably between 50° C. and 70° C. In this bath the portions of the metallization 7,8 not protected by the photoresist mask are etched away. The photoresist mask is then removed by a suitable solvent, typically acetone. The resulting state of the semiconductor wafer with the remaining portions of the metallization layers 7 and 8 is shown in FIG. 4.

After the removal of the photoresist mask, the wafer is thoroughly washed and dried and thereafter it is tempered in a forming gas (largely $N_2$ and $H_2$) atmosphere at a temperature of 475° C. for a period of 15 minutes.

The wafer can thereafter be broken up into individual semiconductor devices by known methods. Thus, the Darlington amplifier illustrated in the drawings could constitute a single chip made from the original wafer, which is commonly in disk shape, and each such chip can then be completed as a separate semiconductor device.

Each of the individual chip devices can then be provided with electrode leads that the soldered onto the nickel surface of the metallization, utilizing the usual soldering techniques. The nickel surfaces produced in accordance with the above procedure are easily wetted by the usual soft solders composed of lead and/or tin.

It is possible also, however, to provide a soft solder coating on the nickel surfaces before the separation of the disk wafer into individual components. That may be done by a known solder dip process or by a known solder wave process (in which the surface to be coated with solder is passed by in contact with a wave of flowing solder formed by causing melted solder to flow over a weir or the like). When the method of the present invention is used to provide metallized layers on a ceramic substrate (whether or not provided with thin film electronic component layers), the process parameters should be the same as those above mentioned in connection with the illustrative example of providing a metallized layer on a semiconductor device substrate.

I claim:

1. A method of manufacturing a solderable metallized layer of high transverse electrical conductivity on a substrate, in which heat-tempering of an aluminum layer is necessary to provide adequate mechanical and electrical contact thereof and a nickel layer is provided for solderability, comprising the steps of:

applying to said substrate (1) an aluminum layer (7) of a thickness in the range of 3 to 10 $\mu$m;

applying under vacuum on top of said aluminum layer (7), a layer of nickel (8) which provides the entire nickel content of the metallization and has a thickness in the range from 0.6 to 1.0 $\mu$m, the application of said nickel layer being performed without interruption of the vacuum established for the previous application of aluminum;

performing the tempering of the aluminum layer necessary for improving its electrical contact capability by heating said substrate and said applied layers, after the deposition of all of said nickel layer, to a temperature in the range of 400 to 480° C. and then maintaining said substrate and said applied layers at such a temperature for a period of not more than 20 minutes, whereby the electrical contact of said aluminum layer is improved without impairing the solderability of said nickel layer.

2. A method as defined in claim 1, in which the period of maintaining said temperature in said tempering step is not less than 10 minutes.

3. A method as defined in claim 2, in which the tempering period has a duration of about 15 minutes and in which the tempering temperature is about 475° C.

4. A method as defined in claim 2, in which the tempering period has a duration of about 15 minutes and in which the tempering temperature is about 475° C.

5. A method as defined in claim 2, in which said substrate (1) is of a solid insulator material.

6. A method as defined in claim 5, in which said substrate is of a ceramic material.

7. A method as defined in claim 5, in which said insulator material is a solid material selected from the group consisting of glasses, oxides other than glasses, mixtures of oxides other than glasses, nitrides, and mixtures of nitrides.

8. A method as defined in claim 2, in which said substrate is of a solid semiconductor material and said tempering step after the deposition of the nickel layer improves the electrical contact of said aluminum layer with said substrate.

9. A method as defined in claim 2, in which said substrate is a component electrical apparatus made on a silicon blank covered at least partly with a protective surface layer consisting of at least one insulating material.

10. A method as defined in claim 9, in which said protective layer of said substrate at least part of which is a silicon oxide layer lying directly on the semiconductor body of said apparatus component.

11. A method as defined in claim 10, in which said surface layer of said substrate includes a nitride layer superimposed on said silicon oxide layer.

12. A method as defined in claim 11, in which said surface layer of said substrate includes a glass layer superimposed upon said nitride layer.

13. A method as defined in claim 1, in which said substrate is a component electrical apparatus made on a silicon blank covered at least partly with a protective surface layer consisting of at least one insulating material.

* * * * *